US012726210B2

(12) United States Patent
Hung et al.

(10) Patent No.: US 12,726,210 B2
(45) Date of Patent: Sep. 1, 2026

(54) SELF-CALIBRATION DIGITAL-TO-ANALOG CONVERTER AND CALIBRATION METHOD THEREOF

(71) Applicant: NUVOTON TECHNOLOGY CORPORATION, Hsinchu City (TW)

(72) Inventors: Wei Min Hung, Zhubei City (TW); Hsin Hung Chen, Zhubei City (TW)

(73) Assignee: NUVOTON TECHNOLOGY CORPORATION, Hsinchu City (TW)

(*) Notice: Subject to any disclaimer, the term of this patent is extended or adjusted under 35 U.S.C. 154(b) by 109 days.

(21) Appl. No.: 18/965,119

(22) Filed: Dec. 2, 2024

(65) Prior Publication Data

US 2026/0019087 A1 Jan. 15, 2026

(30) Foreign Application Priority Data

Jul. 10, 2024 (TW) ................................ 113125786

(51) Int. Cl.

| | |
|---|---|
| ***H03M 1/10*** | (2006.01) |
| *H03M 1/66* | (2006.01) |
| *H03M 1/68* | (2006.01) |
| *H03M 1/70* | (2006.01) |

(52) U.S. Cl.

CPC ............ *H03M 1/1023* (2013.01); *H03M 1/66* (2013.01); *H03M 1/68* (2013.01); *H03M 1/70* (2013.01)

(58) Field of Classification Search

CPC ........ H03M 1/1023; H03M 1/66; H03M 1/68; H03M 1/70

See application file for complete search history.

(56) References Cited

U.S. PATENT DOCUMENTS

2008/0030489 A1* 2/2008 Kim ..................... H03M 1/682 345/204

* cited by examiner

*Primary Examiner* — Joseph J Lauture

(74) *Attorney, Agent, or Firm* — MUNCY, GEISSLER, OLDS & LOWE, P.C.

(57) ABSTRACT

A self-calibration digital-to-analog converter (DAC) and a calibration method for DAC are provided. The circuit includes a resistor circuit, a buffer amplifier, a fine-tuning circuit, and a correction switching circuit. In normal operation mode, the resistor circuit receives the common voltage for conversion. In correction mode, the circuit performs self-correction in a sampling time and a comparison time. During the sampling time, the resistor circuit receives the reference voltage and first correction data, and the buffer amplifier input samples the voltage. During the comparison time, the resistor circuit receives the common connection voltage and second correction data, and the fine-tuning circuit adjusts the correction data until the buffer amplifier output voltage flips and records the correction value corresponding to the second correction data. With this self-correction mechanism, the circuit can output theoretically correct digital-to-analog conversion results under the reference voltage and common connection voltage.

10 Claims, 2 Drawing Sheets

SELF-CALIBRATION DIGITAL-TO-ANALOG CONVERTER AND CALIBRATION METHOD THEREOF

CROSS-REFERENCE TO RELATED APPLICATION

This application claims the priority benefit of Taiwan application serial no. 113125786, filed Jul. 10, 2024, the full disclosure of which is incorporated herein by reference.

BACKGROUND

Technical Field

The present invention relates to a digital-to-analog converter (DAC) technique, and particularly relates to a self-calibration DAC and a calibration method of DAC.

Description of Related Art

In the design of digital and analog systems, a digital-to-analog converter (DAC) plays the critical role of converting digital data to analog voltages or analog currents. However, due to the influence of factors such as process variation, element aging and so on, it is common for the output value of a DAC to deviate from the ideal value, resulting in the decrease of the precision of conversion. To guarantee the performance of a DAC, the process of calibration becomes an essential step.

Traditionally, there are two main methods of the calibration of a DAC. The first method is directly measuring the output voltage of the DAC and then correct the resistor serial array. The correcting method includes using electrical fuses (eFuse) and fusing specific resistor(s) or removing resistor (s) with laser cuts to adjust the resistance value. Such a method may effectively improve the linearity of conversion but requires special processes to embed eFuses or laser cut devices, which significantly increases the complexity of manufacturing and cost.

The second calibration method is using an additional calibration DAC to connect with the original DAC in parallel and compensating the original DAC according to the output deviation thereof. Such a method does not need a special process but requires additional silicon wafer area to accommodate the calibration DAC, and the calibration DAC consistently consumes power during operation, which increases the power consumption of the system.

Whether calibration method is adopted, it is required to perform full-code scanning to the DAC under a controlled measuring environment and precisely measure the output voltage or current corresponding to each digital input. Such measuring processes are not only time-consuming but also demanding high-precision test devices such as high-precision digital voltmeters, resulting in the high cost of calibration.

Although current DAC calibration techniques may increase the precision of conversion to some extent, each of them has defects such as process complexity, area, high indirect cost such as power consumption, high testing cost, and so on. Thus, a new low-cost and high-efficiency calibration method is desired.

SUMMARY

An embodiment of the present invention provides a self-calibration digital-to-analog conversion circuit and a calibration method of a digital-to-analog converter (DAC) to calibrate output inaccuracy due to interior impedance drifts of the DAC.

An embodiment of the present invention provides a self-calibration digital-to-analog conversion circuit. The self-calibration digital-to-analog conversion circuit includes a resistor circuit, a buffer amplifier, a fine-tuning circuit and a correction switching circuit. The resistor circuit includes a plurality of bit input terminals, a reference voltage input terminal, an output terminal and a common connection correction terminal, in which the reference voltage input terminal of the resistor circuit receives a reference voltage. A first input terminal of the fine-tuning circuit is coupled to the output terminal of the resistor circuit, an output terminal of the fine-tuning circuit is coupled to a first input terminal of the buffer amplifier, and a second input terminal of the fine-tuning circuit is coupled to an output terminal of the buffer amplifier. A first terminal of the correction switching circuit is coupled to a second terminal of the buffer amplifier, and a second terminal of the correction switching circuit is coupled to the output terminal of the buffer amplifier.

In the self-calibration digital-to-analog conversion circuit, under a normal operation mode, the common connection correction terminal of the resistor circuit is input with a common connection voltage, and the first terminal and the second terminal of the correction switching circuit are short-circuited. In the self-calibration digital-to-analog conversion circuit, a correction mode includes a sampling time and a comparison time. During the sampling time, the first terminal and the second terminal of the correction switching circuit are short-circuited, in which the common connection correction terminal of the resistor circuit is input the reference voltage, the plurality of bit input terminals are input first correction data, and the first terminal of the correction switching circuit samples a voltage at the second input terminal of the buffer amplifier and temporarily stores the voltage. During the comparison time, the common connection correction terminal of the resistor circuit is input with the common connection voltage, the plurality of bit input terminals of the resistor circuit are input second correction data, the first terminal and second terminal of the correction switching circuit are open-circuited, and the voltage sampled at the first terminal of the correction switching circuit is output to the second input terminal of the buffer amplifier, in which, during the comparison time, the fine-tuning circuit adjusts correction data and adjusts a voltage at the output terminal of the fine-tuning circuit according to the correction data until a voltage at the output terminal of the buffer amplifier switches from a first saturation voltage to a second saturation voltage.

In which, the fine-tuning records the correction data when the voltage at the output terminal of the buffer amplifier switches from the first saturation voltage to the second saturation voltage as a correction value corresponding to the second correction data, in which when the common connection terminal of the resistor circuit is input the reference voltage and the resistor circuit is input the first correction data, an ideal voltage at the output terminal of the resistor circuit is a first theoretical voltage, in which when the common connection terminal of the resistor circuit is input the common connection voltage and the resistor circuit is input the second correction data, an ideal voltage at the output terminal of the resistor circuit is a second theoretical voltage, and in which the first theoretical voltage equals to the second theoretical voltage.

Another embodiment of the present invention provides a calibration method of a digital-to-analog converter (DAC), the calibration method of DAC including providing a buffer amplifier and a resistor circuit; dividing a correction time into a sampling time and a comparison time; during the sampling time, controlling a second input terminal of the buffer amplifier and an output terminal of the buffer amplifier to be short-circuited; inputting first correction data from the resistor circuit and inputting a reference voltage to a common connection terminal of the resistor circuit so that the resistor circuit generates a first voltage and outputs the first voltage to a first input terminal of the buffer amplifier; sampling the first voltage at the second input terminal of the buffer amplifier; during the comparison time, controlling the second input terminal of the buffer amplifier and the output terminal of the buffer amplifier to be open-circuited; inputting a common connection voltage to the common connection terminal of the resistor circuit and inputting second correction data to the resistor circuit so that the resistor circuit generates a second voltage and outputs the second voltage to the first input terminal of the buffer amplifier; outputting the sampled voltage to the second input terminal of the buffer amplifier; adjusting correction data and adjusting the voltage according to the correction data until the voltage at the output terminal of the buffer amplifier switches from a first saturation voltage to a second saturation voltage; and recording the correction data when the voltage at the output terminal of the buffer amplifier switches from the first saturation voltage to the second saturation voltage as a correction value corresponding to the second correction data, in which when the common connection terminal of the resistor circuit is input the reference voltage and the resistor circuit is input the first correction data, an ideal voltage at the output terminal of the resistor circuit is a first theoretical voltage, in which when the common connection terminal of the resistor circuit is input the common connection voltage and the resistor circuit is input the second correction data, an ideal voltage at the output terminal of the resistor circuit is a second theoretical voltage, and in which the first theoretical voltage equals to the second theoretical voltage.

To further understand the technology, means and effects of the present invention, the following detailed description and accompanied drawings may be referred to understand the goals, features and concepts of the present invention thoroughly and specifically. However, the following detailed description and drawings are merely provided as references and explanations of the embodiments of the present invention and not as limitations of the present invention.

BRIEF DESCRIPTION OF THE DRAWINGS

The drawings are provided for persons skilled in the art of the present invention to further understand the present invention and are incorporated into and constitute part of the disclosure of the present invention. The drawings show exemplary embodiments of the present invention and are used to explain the principles of the present invention alongside the Specification of the present invention.

DETAILED DESCRIPTION

Figure 1:
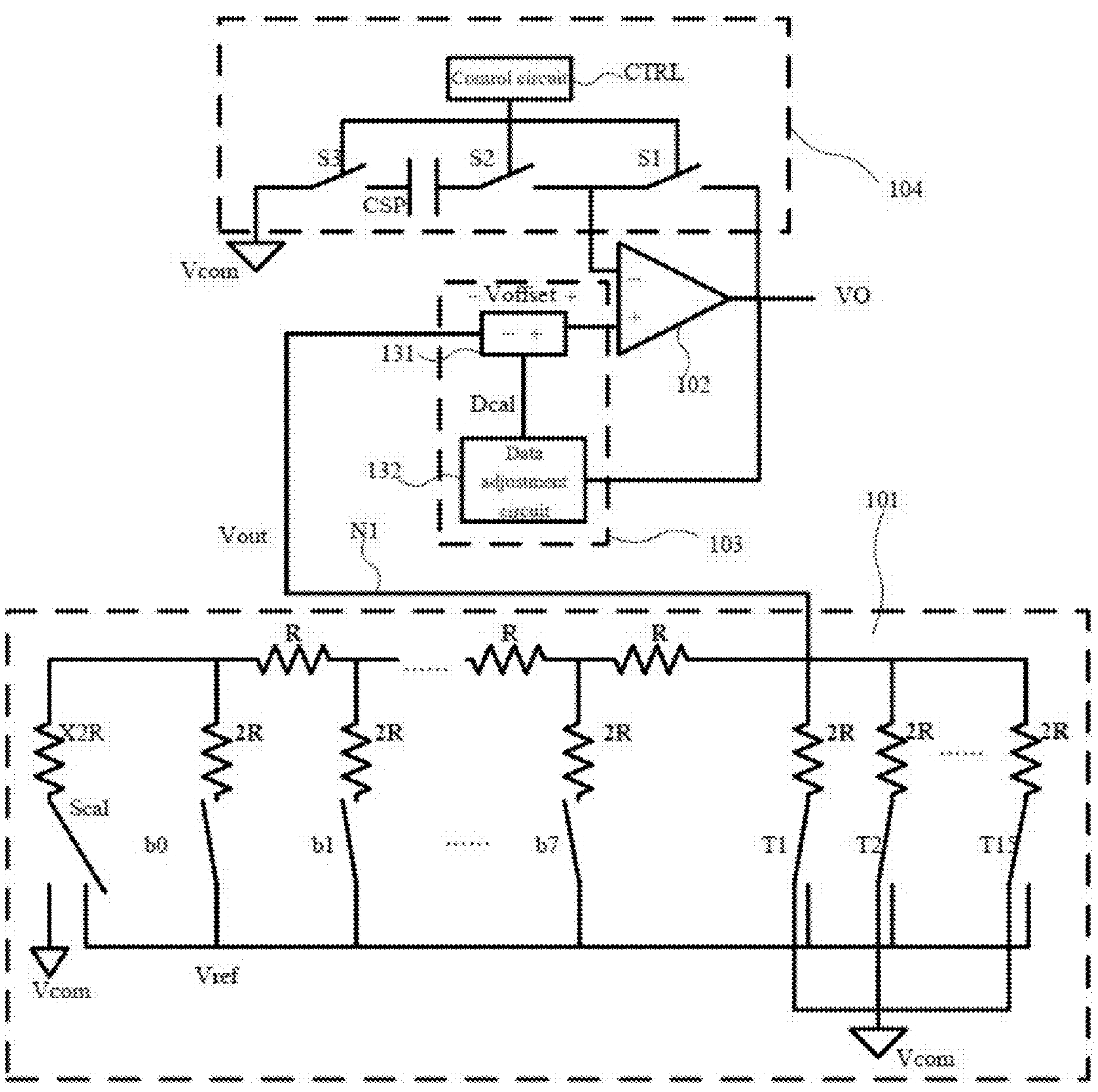
FIG. 1 is illustrated as a circuit block diagram of a self-calibration digital-to-analog conversion circuit of a preferred embodiment of the present invention.

Herein, exemplary embodiments of the present invention are referred to in detail, and the exemplary embodiments are shown in the drawings. Same element numerals are used to represent same or similar elements in the drawings and Specification whenever possible. Also, the approach of exemplary embodiments is merely one of the realizations of the design concepts of the present invention, and the following plurality of examples are not intended to limit the present invention.

FIG. 1 is illustrated as a circuit block diagram of a self-calibration digital-to-analog conversion circuit of a preferred embodiment of the present invention. Referring to FIG. 1, the self-calibration digital-to-analog conversion circuit includes a resistor circuit 101, a buffer amplifier 102, a fine-tuning circuit 103 and a correction switching circuit 104. In the embodiment, the resistor circuit 101 itself is of the pattern of a digital-to-analog converter (DAC). In the embodiment, the resistor circuit 101 is embodied as an R-2R resistor ladder circuit at the 8-bit least significant bit (LSB) part, that is, each second resistor R is coupled between first resistors 2R, and the foremost resistor is regarded as a correction resistor X2R in this embodiment. Under a normal operation mode, the correction resistor X2R is coupled to a common connection voltage Vcom through a correction switch Scal, and under a correction mode, the correction resistor X2R is coupled to a reference voltage Vref through the correction switch Scal. In another embodiment, under the correction mode, the correction resistor X2R may be coupled to the common connection voltage Vcom.

The 4-bit most significant bit (MSB) part is embodied with a thermometer code digital-to-analog conversion circuit (thermo-DAC), and thus a preferred embodiment of the present invention is a 12-bit digital-to-analog converter. Because the coding of the thermometer code digital-to-analog converter is determining the number of logical 1s output sequentially with the value of a digit, in the present embodiment, the LSB b0~b7 express a T0 of a thermometer code while T1~T15 varies according to the 4-bit digit of the MSB. For example, when the MSB is 0110, it means that T1~T6 are connected to the reference voltage Vref, the corresponding resistors are input a logical high voltage, and the remaining T7~T15 are connected to a logical low voltage, which is the common connection voltage Vcom. The thermometer code digital-to-analog conversion circuit includes an input terminal and an output terminal. The input terminal of the thermometer code digital-to-analog conversion circuit is coupled to the second terminal of the last one of the first resistors (i.e., the resistor R connected to switch b7 in FIG. 1). The output terminal of the thermometer-coded digital-to-analog conversion circuit is coupled to the first input terminal of the fine-tuning circuit 103.

In the present embodiment, the correction switching circuit 104 includes a first switch S1, a second switch S2, a third switch S3, a sampling capacitor CSP and a control circuit CTRL. In the present embodiment, the control circuit CTRL is utilized to control the on/off condition of first switch S1, the second switch S2 and the third switch S3. In the present embodiment, the fine-tuning circuit 103 includes an offset voltage adjustment circuit 131 and a data adjustment circuit 132. A first input terminal of the offset voltage adjustment circuit 131 receives a voltage Vout at an output terminal of the resistor circuit, an output terminal of the offset voltage adjustment circuit 131 is coupled to a first input terminal of the buffer amplifier 102, and a second input terminal of the offset voltage adjustment circuit 131 receives a data adjustment offset voltage of the data adjustment circuit 132.

It may be understood from the resistor circuit 101 of the embodiment mentioned above that the circuit is a segment DAC. The worst case of a segment DAC falls at the transition between two segments in most cases, which is from 255 (logical 1 at b0~b7) to 256 (logical 0 at b0~b7 and T1 is logical 1) in the present embodiment. To calibrate the worst case between the two segments, in the present embodiment, the circuit enters a correction mode. In this case, the input digital data is 255, but the correction resistor X2R is coupled to the reference voltage Vref, so the output voltage Vout at node N1 equals to the output voltage Vout in which T1 equals to logical 1 and the remaining LSB b0~b7 are logical 0 under an ideal (no error in each element) condition.

In the present embodiment, the correction mode is divided into two time intervals, which are a sampling time and a comparison time. During the sampling time, the control circuit CTRL controls the first switch S1, the second switch S2 and the third switch S3 to be turned on. In this case, the buffer amplifier 102 is utilized as a buffer, that is, the voltage at an output terminal of the buffer amplifier 102 equals to the voltage at a positive input terminal of the buffer amplifier 102. Also, during the sampling time, the correction circuit X2R is coupled to the reference voltage Vref and uses first correction data to input to the R-2R resistor ladder circuit. For example, the first correction data may be 255, which is the case mentioned above in which b0~b7 equal to logical 1. In this case, the output voltage Vout of the resistor circuit 101 equals to the input 256. In this case, the fine-tuning circuit 103 does not act, so the voltage Vout equals to the voltage at the positive input terminal of the buffer amplifier 102. Also, due to the positive input terminal of the buffer amplifier 102 and a negative input terminal of the buffer amplifier 102 being virtual short, in this case, the voltage at the negative input terminal of the buffer amplifier 102 equals to Vout as well. Thus, the sampling capacitor CSP may sample the voltage Vout at the positive input terminal of the buffer amplifier 102. To separate the time interval of voltages, the voltage sampled by the sampling capacitor CSP herein is denoted as Vout[0].

Subsequently, the correction mode enters the comparison time. During the comparison time, the control circuit CTRL controls the first switch S1 to be open-circuited, and then a terminal of the correction resistor X2R of the resistor circuit 101 is input the common connection voltage Vcom, and meanwhile, the plurality of bit input terminals of the resistor circuit 101 are input the second correction data, which is, for example, 256 in this case, which is the case that b0~b7 equal to logical 0 and T1 is logical high voltage, which is the reference voltage Vref. Also, in this case, the first switch S1 of the correction switching circuit 104 is controlled to be open-circuited, the second switch S2 and the third switch S3 are turned on, and the voltage Vout[0] previously sampled by the sampling capacitor CSP is output to the negative input terminal of the buffer amplifier 102, while the positive input terminal of the buffer amplifier 102 receives a voltage Vout[1], which is the logical 1 voltage at T1 (to distinguish the time interval of the output voltage of the resistor circuit 101, the voltage is denoted as Vout[1] herein).

In this case, persons skilled in the art may understand that due to the open circuit of the first switch S1, the buffer amplifier 102 is equivalent to a voltage comparator. When the voltage Vout[1] at the positive input terminal of the buffer amplifier 102 is greater than the voltage Vout[0] at the negative input terminal of the buffer amplifier 102, the output terminal of the buffer amplifier 102 outputs a positive saturation voltage; when the voltage Vout[1] at the positive input terminal of the buffer amplifier 102 is smaller than the voltage Vout[0] at the negative input terminal of the buffer amplifier 102, the output terminal of the buffer amplifier 102 outputs a negative saturation voltage. For the convenience of explanation, assume that the voltage Vout[1] at the positive input terminal of the buffer amplifier 102 is greater than the voltage Vout[0] at the negative input terminal of the buffer amplifier 102. In this case, the fine-tuning circuit 103 starts to operate. When receiving the positive saturation voltage, the data adjustment circuit 132 of the fine-tuning circuit 103 adjusts correction data Dcal of the data adjustment circuit 132 towards the negative direction. In this case, the offset voltage adjustment circuit 131 receives the negative correction data Dcal and adjusts an offset voltage Voffset to a negative voltage, and subsequently, continuously receives the voltage at the output terminal of the buffer amplifier 102, and continuously adjusts the correction data Dcal and the offset voltage Voffset until the positive saturation voltage becomes the negative saturation voltage. In this case, the voltage Vout[1] at the positive input terminal of the buffer amplifier 102 subtracting the offset voltage Voffset is close to the voltage Vout[0] at the negative input terminal of the buffer amplifier 102, which is the previously sampled voltage. Hereby, the correction is finished. After that, under the normal operation mode, when the input data is 256, the data adjustment circuit 132 of the fine-tuning circuit 103 directly outputs the previously adjusted correction data Dcal, and the offset voltage adjustment circuit 131 outputs the corresponding offset voltage Voffset to perform an output correction to the data 256.

Similarly, assume that the voltage Vout[1] at the positive input terminal of the buffer amplifier 102 is smaller than the voltage Vout[0] at the negative input terminal of the buffer amplifier 102. In this case, the fine-tuning circuit 103 starts to operate. When receiving the negative saturation voltage, the data adjustment circuit 132 of the fine-tuning circuit 103 adjusts correction data Dcal of the data adjustment circuit 132 towards the positive direction. In this case, the offset voltage adjustment circuit 131 receives the positive correction data Dcal and adjusts an offset voltage Voffset to a positive voltage, and subsequently, continuously receives the voltage at the output terminal of the buffer amplifier 102, and continuously adjusts the correction data Dcal and the offset voltage Voffset until the negative saturation voltage becomes the positive saturation voltage. In this case, the voltage Vout[1] at the positive input terminal of the buffer amplifier 102 adding the offset voltage Voffset is close to the voltage Vout[0] at the negative input terminal of the buffer amplifier 102, which is the previously sampled voltage. Hereby, the correction is finished. After that, under the normal operation mode, when the input data is 256, the data adjustment circuit 132 of the fine-tuning circuit 103 directly outputs the previously adjusted correction data Dcal, and the offset voltage adjustment circuit 131 outputs the corresponding offset voltage Voffset to perform an output correction to the data 256.

It may be understood from the foregoing embodiment that through the design of the sampling time and the comparison time, the self-calibration digital-to-analog conversion circuit may automatically correct the precision of conversion during operation and eliminate the circuit offset caused from process deviation, element aging or the mixture of different DACs. Additionally, although 255 is an example of the first correction data and 256 is an example of the second correction data in the foregoing embodiment, persons skilled in the art should understand that the main spirit of the present invention is when the common connection correction terminal (which is the terminal of the correction resistor X2R) of the resistor circuit 101 is input the reference voltage Vref and the first correction data is input to the resistor circuit 101, the theoretical voltage value of the output voltage Vout of the resistor circuit 101 equals to the theoretical voltage value of the output voltage Vout of the resistor circuit 101 when the common connection correction terminal (which is the terminal of the correction resistor X2R) of the resistor circuit 101 is input the common connection voltage Vcom and the second correction data is input to the resistor circuit 101. In terms of the R-2R resistor ladder circuit of the present embodiment, when the first correction data is 1 (which is b0 being equal to logical 1 and b1~b7 equal to logical 0) and the second correction data is 2 (which is b1 being equal to logical 1 and b0 and b2~b7 equal to logical 0), the theoretical voltage value of the output voltage Vout of the resistor circuit 101 while inputting the reference voltage Vref at the terminal of the correction resistor X2R of the former equals to the theoretical voltage value of the output voltage Vout of the resistor circuit 101 while inputting the common connection voltage Vcom at the terminal of the correction resistor X2R of the latter. In other words, even when the embodiment is changed to the first correction data being 1 and the second correction data being 2, the circuit may remain operational. Thus, the present invention is not limited thereto.

Similarly, although the foregoing embodiment appears to be a segment DAC using a mixture of an R-2R resistor ladder circuit and a thermometer code digital-to-analog circuit, persons skilled in the art should understand that the foregoing circuit may be applied to perform data correction when simply using an R-2R resistor ladder circuit or a thermometer code digital-to-analog circuit, and the present invention is not limited thereto. In other words, the variation of the resistor circuit 101 is not the subject matter of the present invention when the foregoing spirit is met, and the present invention is not limited thereto.

Figure 2:
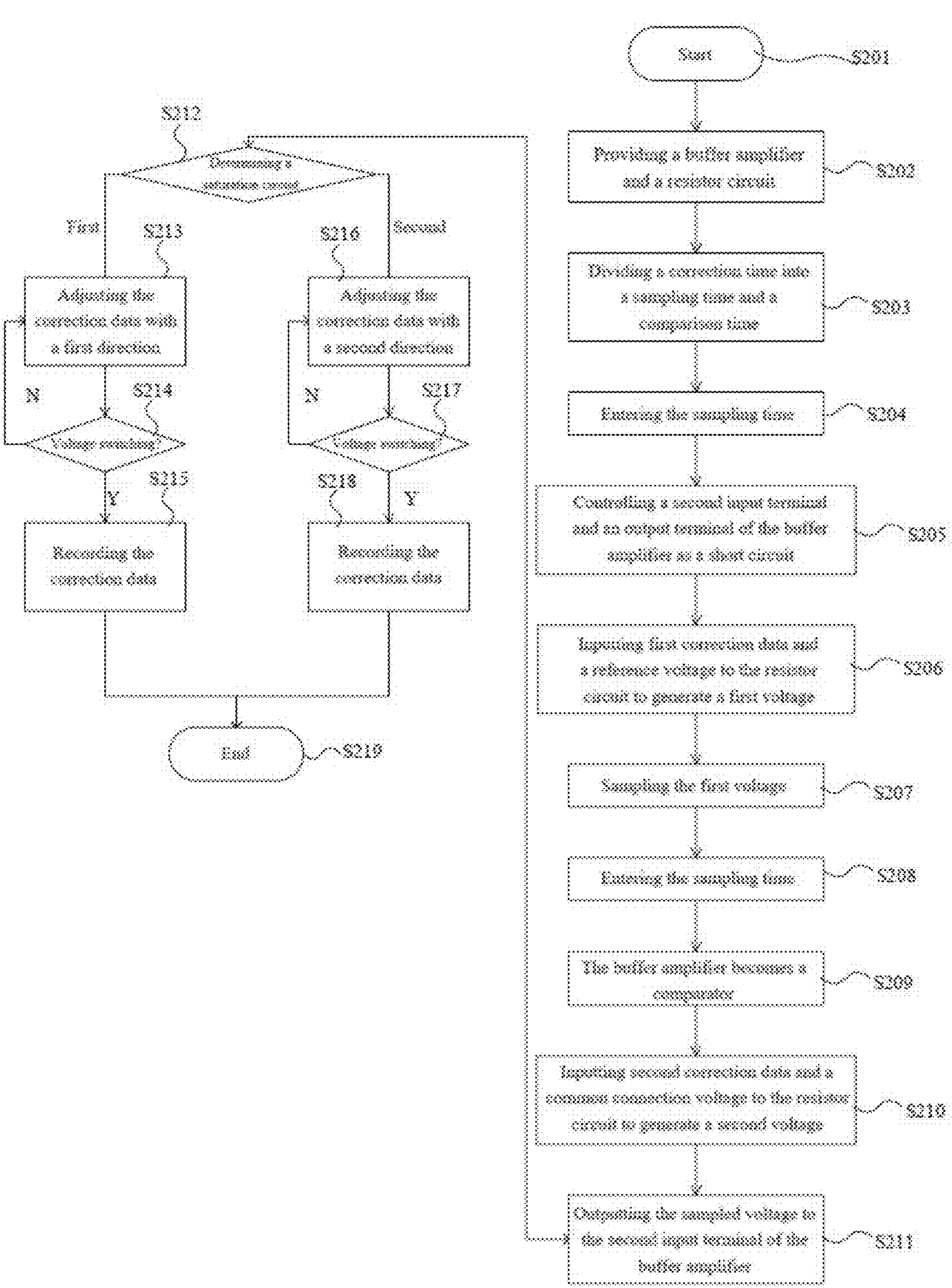
FIG. 2 is illustrated as a flow diagram of a calibration method of a digital-to-analog converter (DAC) of a preferred embodiment of the present invention.

From the foregoing embodiment, a calibration method of a DAC may be induced. FIG. 2 is illustrated as a flow diagram of a calibration method of a digital-to-analog converter (DAC) of a preferred embodiment of the present. Referring to FIG. 2, the calibration method of a DAC includes the following steps:

Step S201: Start.

Step S202: Providing a buffer amplifier and a resistor circuit.

Step S203: Dividing a correction time into a sampling time and a comparison time.

Step S204: Entering the sampling time.

Step S205: Controlling a second input terminal of the buffer amplifier and an output terminal of the buffer amplifier as a short circuit.

Step S206: Inputting first correction data to the resistor circuit and inputting a reference voltage to a common connection terminal of the resistor for the resistor circuit to generate a first voltage output to a first input terminal of the buffer amplifier.

Step S207: Sampling a first voltage from a second input terminal of the buffer amplifier.

Step S208: Entering the comparison time.

Step S209: Controlling a second input terminal of the buffer amplifier and an output terminal of the buffer amplifier as an open circuit, in which the buffer amplifier serves as a comparator.

Step S210: Inputting a common connection voltage to a common connection terminal of the resistor circuit and inputting second correction data to the resistor circuit for the resistor circuit to generate a second voltage output to the first input terminal of the buffer amplifier.

Step S211: Outputting the sampled voltage to the second input terminal of the buffer amplifier.

Step S212: Determining an output voltage of the buffer amplifier as a first saturation voltage or a second saturation voltage. If determined as the first saturation voltage, proceeding to step S213. If determined as the second saturation voltage, proceeding to step S216.

Step S213: Adjusting the correction data with a first direction and adjusting the voltage with the correction data. For example, for the positive saturation voltage mentioned above, adjusting the correction data with a negative direction.

Step S214: Determining whether a voltage at the output terminal switches from the first saturation voltage to the second saturation voltage. If determined as no, going back to step S213. If determined as yes, proceeding to step S215.

Step S215: Recording the correction data. Recording the correction data of the voltage at the output terminal of the buffer amplifier while switching from the first saturation voltage to the second saturation voltage as a correction value corresponding to the second correction data.

Step S216: Adjusting the correction data with a second direction and adjusting the voltage with the correction data. For example, for the negative saturation voltage mentioned above, adjusting the correction data with a positive direction.

Step S217: Determining whether the voltage at the output terminal switches from the second saturation voltage to the first saturation voltage. If determined as no, going back to step S216. If determined as yes, proceeding to step S218.

Step S218: Recording the correction data. Recording the correction data of the voltage at the output terminal of the buffer amplifier while switching from the second saturation voltage to the first saturation voltage as a correction value corresponding to the second correction data.

Step S219: End.

In conclusion, a preferred embodiment of the present invention provides a self-calibration digital-to-analog conversion circuit, which may automatically correct the precision of conversion during operation and eliminate the circuit offset caused from process deviation, element aging or the mixture of different DACs through the design of the sampling time and comparison time, and thus ensures the long-term stability of precision of conversion. Additionally, the process of correction does not need the intervention of external instruments and requires merely simple switches of the internal connections of the circuit, which is convenient and reduces cost. Also, the present circuit maintains the structural advantage of traditional resistor serial-parallel DACs, which has small size, low power consumption and good process compatibility. Thus, the self-calibration digital-to-analog circuit of a preferred embodiment of the present invention has practical value and may be widely applied in analog/digital systems requiring high precision and high reliability to increase the performance of the system and the lifetime of the product.

It should be understood that the examples and embodiments described herein are merely intended to be used as explanations, and various modifications or alterations in view of which are suggested to persons skilled in the art and are included within the spirit and scope and the scope of the appended claims of the present disclosure.

What is claimed is:

1. A self-calibration digital-to-analog conversion circuit, comprising:

a resistor circuit, comprising a plurality of bit input terminals, a reference voltage input terminal, an output terminal and a common connection correction terminal, wherein the reference voltage input terminal of the resistor circuit receives a reference voltage;

a buffer amplifier, comprising a first input terminal, a second terminal and an output terminal;

a fine-tuning circuit, comprising a first input terminal, a second terminal and an output terminal, wherein the first input terminal of the fine-tuning circuit is coupled to the output terminal of the resistor circuit, the output terminal of the fine-tuning circuit is coupled to the first input terminal of the buffer amplifier, the second input terminal of the fine-tuning circuit is coupled to the output terminal of the buffer amplifier; and a correction switching circuit, comprising a first terminal and a second terminal, wherein the first terminal of the correction switch circuit is coupled to the second input terminal of the buffer amplifier, the second terminal of the correction switching circuit is coupled to the output terminal of the buffer amplifier, wherein, in the self-calibration digital-to-analog conversion circuit, under a normal operation mode, the common connection correction terminal of the resistor circuit is input a common connection voltage, and the first terminal and the second terminal of the correction switching circuit are short-circuited;

wherein the self-calibration digital-to-analog conversion circuit, under a correction mode, comprises:

a sampling time: the first terminal and the second terminal of the correction switching circuit are short-circuited, wherein the common connection correction terminal of the resistor circuit is input the reference voltage, the plurality of bit input terminals of the resistor circuit are input first correction data, and the first terminal of the correction switching circuit samples a voltage at the second input terminal of the buffer amplifier and stores the voltage; and a comparison time: the common connection correction terminal of the resistor terminal is input a common connection voltage, the plurality of bit input terminals of the resistor circuit are input second correction data, the first terminal and the second terminal of the correction switching circuit are open-circuited, and the voltage sampled at the first terminal of the correction switching circuit is output to the second input terminal of the buffer amplifier, wherein, during the comparison time, the fine-tuning circuit adjusts correction data and adjusts the voltage at the output terminal of the fine-tuning circuit according to the correction data until a voltage at the output terminal of the buffer amplifier switches from a first saturation voltage to a second saturation voltage, wherein the fine-tuning circuit records the correction data when the voltage at the output terminal of the buffer amplifier switches from the first saturation voltage to the second saturation voltage as the correction data corresponding to the second correction data, wherein, when the common connection correction terminal of the resistor circuit is input the reference voltage and the resistor circuit is input the first correction data, an ideal voltage at the output terminal of the resistor circuit is a first theoretical voltage, wherein, when the common connection correction terminal of the resistor circuit is input the common connection voltage and the resistor circuit is input the second correction data, an ideal voltage at the output terminal of the resistor circuit is a second theoretical voltage, and wherein the first theoretical voltage equals to the second theoretical voltage.

2. The self-calibration digital-to-analog conversion circuit of claim 1, wherein the resistor circuit comprises:

an R-2R resistor ladder circuit, comprising:

a plurality of switch circuit, wherein each of the plurality of the switch circuit comprises a control terminal, a first terminal and a second terminal, wherein the first terminal of each of the plurality of the switch circuits is coupled to the reference voltage input terminal of the resistor circuit to receive the reference voltage, the control terminals of the plurality of switch circuits are respectively coupled to the plurality of bit input terminals;

a plurality of first resistors, wherein each of the plurality of first resistors comprises a first terminal and a second terminal, wherein the first terminals of the plurality of first resistors are respectively coupled to the second terminals of the plurality of switch circuits;

a plurality of second resistors, wherein each of the plurality of second resistors comprises a first terminal and a second terminal, wherein the first terminal of the K-th second resistor is coupled to the second terminal of the K-th first resistor, and the second terminal of the K-th second resistor is coupled to the second terminal of the (K+1)-th first resistor; and a correction resistor, comprising a first terminal and a second terminal, wherein the first terminal of the correction resistor is coupled to the common connection correction terminal, the second terminal of the correction resistor is coupled to the second terminal of the foremost first resistor and the first terminal of the foremost second resistor, wherein K is a natural number greater than 0 and smaller than a total number of the first resistors.

3. The self-calibration digital-to-analog conversion circuit of claim 2, wherein the resistor circuit further comprises:

a thermometer code digital-to-analog converter (thermo-DAC), comprising an input terminal and an output terminal, wherein the input terminal of the thermo-DAC is coupled to the second terminal of the last one of the first resistors, and the output terminal of the thermo-DAC is coupled to the first input terminal of the fine-tuning circuit.

4. The self-calibration digital-to-analog conversion circuit of claim 1, wherein the correction switching circuit further comprises:

a first switch, comprising a first terminal, a second terminal and a control terminal, wherein the first terminal of the first switch is coupled to the second input terminal of the buffer amplifier, the second terminal of the first switch is coupled to the output terminal of the buffer amplifier;

a second switch, comprising a first terminal, a second terminal and a control terminal, wherein the first terminal of the second switch is coupled to the second input terminal of the buffer amplifier;

a sampling capacitor, comprising a first terminal and a second terminal, wherein the first terminal of the sampling capacitor is coupled to the second terminal of the second switch;

a third switch, comprising a first terminal, a second terminal and a control terminal, wherein the first terminal of the third switch is coupled to the second terminal of the sampling capacitor, and the second terminal of the third switch is coupled to the common connection voltage; and a control circuit, coupled to the control terminals of the first switch, the second switch and the third switch, wherein, during the normal operation mode, the control circuit controls the first switch to be turned on, and controls the second switch and the third switch to be turned off, wherein, during the sampling time, the control circuit controls the first switch, the second switch and the third switch to be turned on, and wherein, during the comparison time, the control circuit controls the first switch to be turned off, and controls the second switch and the third switch to be turned on.

5. The self-calibration digital-to-analog conversion circuit of claim 1, wherein the fine-tuning circuit comprises:

an offset voltage adjustment circuit, comprising a first input terminal, a second input terminal and an output terminal, wherein the first input terminal of the offset voltage adjustment circuit is coupled to the output terminal of the resistor circuit, and the output terminal of the offset voltage adjustment circuit is coupled to the first input terminal of the buffer amplifier; and a data adjustment circuit, comprising an input terminal and an output terminal, wherein the input terminal of the data adjustment circuit is coupled to the output terminal of the buffer amplifier, and the output terminal of the data adjustment circuit outputs the correction data to the second input terminal of the offset voltage adjustment circuit, and wherein the data adjustment circuit determines a direction of adjustment of the correction data according to the first saturation voltage at the output terminal of the buffer amplifier until the voltage at the output terminal of the buffer amplifier is switched to the second saturation voltage.

6. A calibration method of a digital-to-analog converter (DAC), comprising:

providing a buffer amplifier and a resistor circuit;

dividing a correction time into a sampling time and comparison time;

during the sampling time:

controlling a second input terminal of the buffer amplifier and an output terminal of the buffer amplifier to be short-circuited;

inputting first correction data to the resistor circuit and inputting a reference voltage to a common connection correction terminal of the resistor circuit for the resistor circuit to generate a first voltage output to a first input terminal of the buffer amplifier;

sampling the first voltage at the second input terminal of the buffer amplifier; and during the comparison time:

controlling the second input terminal of the buffer amplifier and the output terminal of the buffer amplifier to be open-circuited;

inputting a common connection voltage to the common connection correction terminal of the resistor circuit and inputting second correction data to the resistor circuit for the resistor circuit to generate a second voltage output to the first input terminal of the buffer amplifier;

outputting the sampled voltage to the second input terminal of the buffer amplifier;

adjusting correction data and adjusting a voltage of the first input terminal of the buffer amplifier according to the correction data until the voltage at the output terminal of the buffer amplifier switches from a first saturation voltage to a second saturation voltage; and recording the correction data when the voltage at the output terminal of the buffer amplifier switches from the first saturation voltage to the second saturation voltage as the correction data corresponding to the second correction data, wherein, when the common connection correction terminal of the resistor circuit is input the reference voltage and the resistor circuit is input the first correction data, an ideal voltage at the output terminal of the resistor circuit is a first theoretical voltage, wherein, when the common connection correction terminal of the resistor circuit is input the common connection voltage and the resistor circuit is input the second correction data, an ideal voltage at the output terminal of the resistor circuit is a second theoretical voltage, and wherein the first theoretical voltage equals to the second theoretical voltage.

7. The calibration method of DAC of claim 6, wherein the resistor circuit comprises:

an R-2R resistor ladder circuit, comprising:

a plurality of switch circuit, wherein each of the plurality of the switch circuit comprises a control terminal, a first terminal and a second terminal, wherein the first terminal of each of the plurality of the switch circuits is coupled to the reference voltage input terminal of the resistor circuit to receive the reference voltage, the control terminals of the plurality of switch circuits are respectively coupled to the plurality of bit input terminals;

a plurality of first resistors, wherein each of the plurality of first resistors comprises a first terminal and a second terminal, wherein the first terminals of the plurality of first resistors are respectively coupled to the second terminals of the plurality of switch circuits;

a plurality of second resistors, wherein each of the plurality of second resistors comprises a first terminal and a second terminal, wherein the first terminal of the K-th second resistor is coupled to the second terminal of the K-th first resistor, and the second terminal of the K-th second resistor is coupled to the second terminal of the (K+1)-th first resistor; and a correction resistor, comprising a first terminal and a second terminal, wherein the first terminal of the correction resistor is coupled to the common connection correction terminal, the second terminal of the correction resistor is coupled to the second terminal of the foremost first resistor and the first terminal of the foremost second resistor, wherein K is a natural number greater than 0 and smaller than a total number of the first resistors.

8. The calibration method of DAC of claim 7, wherein the resistor circuit further comprises:

a thermometer code digital-to-analog converter (thermo-DAC), comprising an input terminal and an output terminal, wherein the input terminal of the thermo- DAC is coupled to the second terminal of the last one of the first resistors, and the output terminal of the thermo-DAC is coupled to the first input terminal of the fine-tuning circuit.

9. The calibration method of DAC of claim 6, wherein the first correction data is $2^N-1$, and the second correction data is $2^N$, and wherein N is a natural number.

10. The calibration method of DAC of claim 6, further comprises:

determining a direction of adjustment of the correction data according to a polarity of the first saturation voltage.

* * * * *